Figure 1:
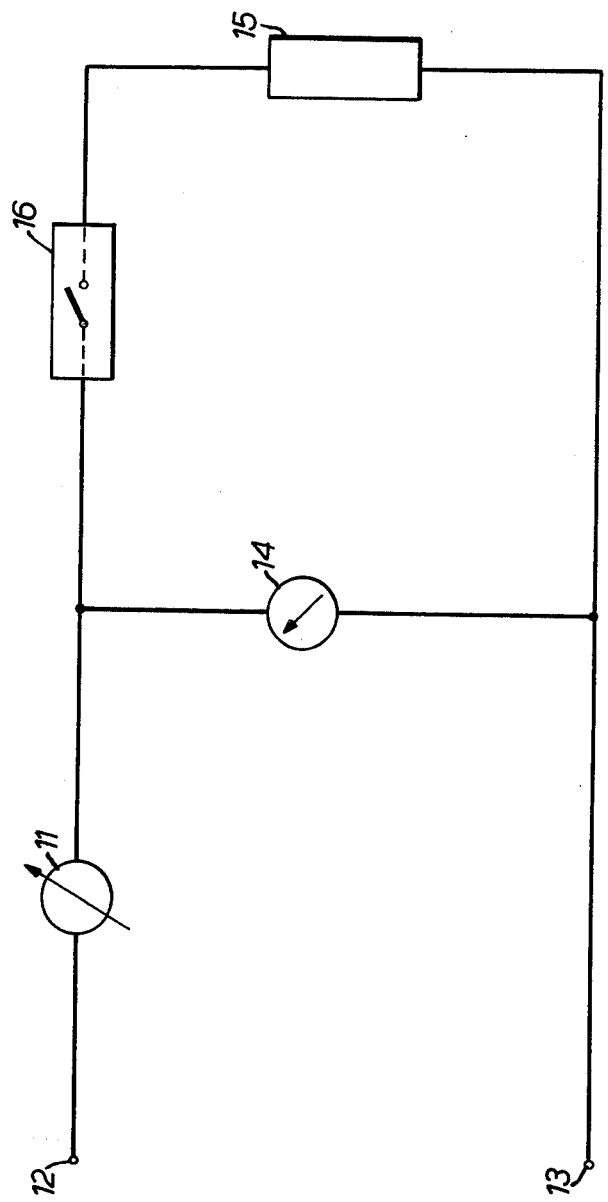

United States Patent [19]

Johnston et al.

[11] 4,135,129
[45] Jan. 16, 1979

[54] GROUND FAULT CIRCUIT INTERRUPTOR TEST APPARATUS

[76] Inventors: John K. Johnston, 6/48 Albert St., Belmore, New South Wales, 2192; Frederick A. Edwards, 53 Lady Game Dr., Killara, New South Walles, 2071, both of Australia

[21] Appl. No.: 767,626

[22] Filed: Feb. 10, 1977

[30] Foreign Application Priority Data

Feb. 10, 1976 [AU] Australia ............................ PC4794

[51] Int. Cl.² ........................................... G01R 31/02
[52] U.S. Cl. .................................................. 324/51
[58] Field of Search .................... 324/51, 54; 340/255; 361/45, 58

[56] References Cited

U.S. PATENT DOCUMENTS

| | | | |
|---|---|---|---|
| 3,281,677 | 10/1966 | Baggott | 324/51 X |
| 3,376,502 | 4/1968 | Rink | 324/51 |
| 3,491,290 | 1/1970 | Peschel | 324/54 |
| 3,548,302 | 12/1970 | Arnold et al. | 324/54 |
| 3,745,453 | 7/1973 | Wright | 324/51 |
| 3,784,903 | 1/1974 | Thomas | 324/51 |
| 3,878,458 | 4/1975 | Muska | 324/51 |
| 3,898,557 | 8/1975 | Strock | 324/51 |
| 3,970,924 | 7/1976 | Pendelton et al. | 324/54 |

*Primary Examiner*—Gerard R. Strecker
*Attorney, Agent, or Firm*—DeLio and Montgomery

[57] ABSTRACT

An electrical testing device adapted to open a circuit upon reaching a predetermined leakage current, including means for generating a leakage current, switching means for applying the leakage current to an electrical circuit and time control means operative to limit the leakage current to the circuit so as to alter the time current characteristic of the leakage current.

2 Claims, 3 Drawing Figures

GROUND FAULT CIRCUIT INTERRUPTOR TEST APPARATUS

This invention relates to electrical test equipment for use with current-operated core balance protection devices.

Users of electrical equipment are exposed to the risk of electric shock through the deterioration of electrical insulation. Where this occurs small leakage currents can flow from the active or phase conductors through the insulation to conductive materials or persons which are at earth potential. Quite small currents have patho-physiologically dangerous effects, or more seriously, lead to ventricular fibrillation or death by shock. Normal circuit protection apparatus such as circuit breakers or fuses offer no protection to disconnect the circuit from these low leakage currents, although they are quite effective against any accidental direct path from the active conductors to earth potential.

Current-operated core balance (earth leakage) protection devices, otherwise known as residual current or ground fault protective devices, provide sensitive protection against small leakage currents. The difference between the current flowing in the active and neutral conductors, which represents leakage current, is detected and if this exceeds a pre-set value the device generates a signal to operate a circuit disconnecting mechanism.

Because these protection devices are relied upon for human safety, it is important to be able to verify the integrity and continued protection of the entire installation, including connected equipment. Periodical checking to ensure there has been no loss in the level of protection due to deterioration of insulation or other circuit variations can be made using a portable test unit connected to the power outlets or circuit terminations.

Where a core balance protection device is fitted to a wiring installation in such a manner to protect a complete circuit with single or multiple outlets or individual outlets on a circuit, it is possible to check the operation of the device by applying a known leakage current from the active to earth at the outlet socket or termination of the circuit. Portable test units are known which can be connected by a plug to the outlet and on which the leakage level can be adjusted. Adjustment may be done directly when the equipment is connected to the circuit or as a preliminary setting, after which the leakage current is switched to the circuit under test.

Both methods described would be technically satisfactory for testing of the protection device if done by trained technicians in areas to which the public does not have access. They create, however, an unsafe and possible lethal hazard of electric shock for users of any equipment connected to the circuit whilst the test is in progress in the event of certain types of otherwise unknown faults being present in the circuit. This is an unacceptable situation for testing installations on domestic or commercial premises.

Hazards can arise from reversal of phase and neutral wiring behind an outlet socket under some circumstances with some types of test equipment. The most extreme hazard can occur where there is a high resistance or open circuit in the earth conductor of the circuit. In this case, whilst the test is in progress, the earthed sections of all equipment connected to the circuit could become live, e.g. the entire metalwork of refrigerators, washing machines, etc. Severe shocks could be experienced and if the earth conductor is broken the combination of continuously applied test leakage current and the voltage could be lethal. A defective earth at a main switchboard could cause a similar shock hazard to appear on equipment connected to circuits other than the circuit under test.

If the test equipment is intended to test the calibration of the protective devices it must provide for a maximum leakage current at least equal to that specified for the devices. The amplitude therefore cannot be reduced in the interests of safety. However, if the duration of the leakage current on the installation is reduced sufficiently a person may make accidental contact with other equipment connected to the circuit and receive an electric shock but this could be of a value below the threshold of any dangerous patho-physiological effect.

A study of the medical aspects of electric current passing through the human body leads to identification of design parameters which can be used to develop technically effective and safe equipment. The degree of risk of electric shock is a function both of the leakage current level and the period of exposure and is further affected by body resistance, voltage, etc.

It is therefore an object of the invention to provide the basis of alternative test methods which eliminate the risk of lethal shock by controlling the test leakage current so that the combination of current and time is below the dangerous levels but yet sufficiently long to provide an effective tripping signal to the core balance protective device.

According to the invention there is provided a test unit for providing a test leakage current to an electric circuit containing a current-operated core balance protective device adapted to open the circuit upon the occurrence of a pre-determined leakage current, said unit including means for generating a leakage current of a magnitude selectable from a pre-determined range, switching means for applying the selected leakage current to the circuit, and time control means operative to limit the application of the selected leakage current to the circuit so that the time-current characteristic of the test leakage current is below the threshold at which dangerous patho-physiological effects are to be expected.

Figure 2:
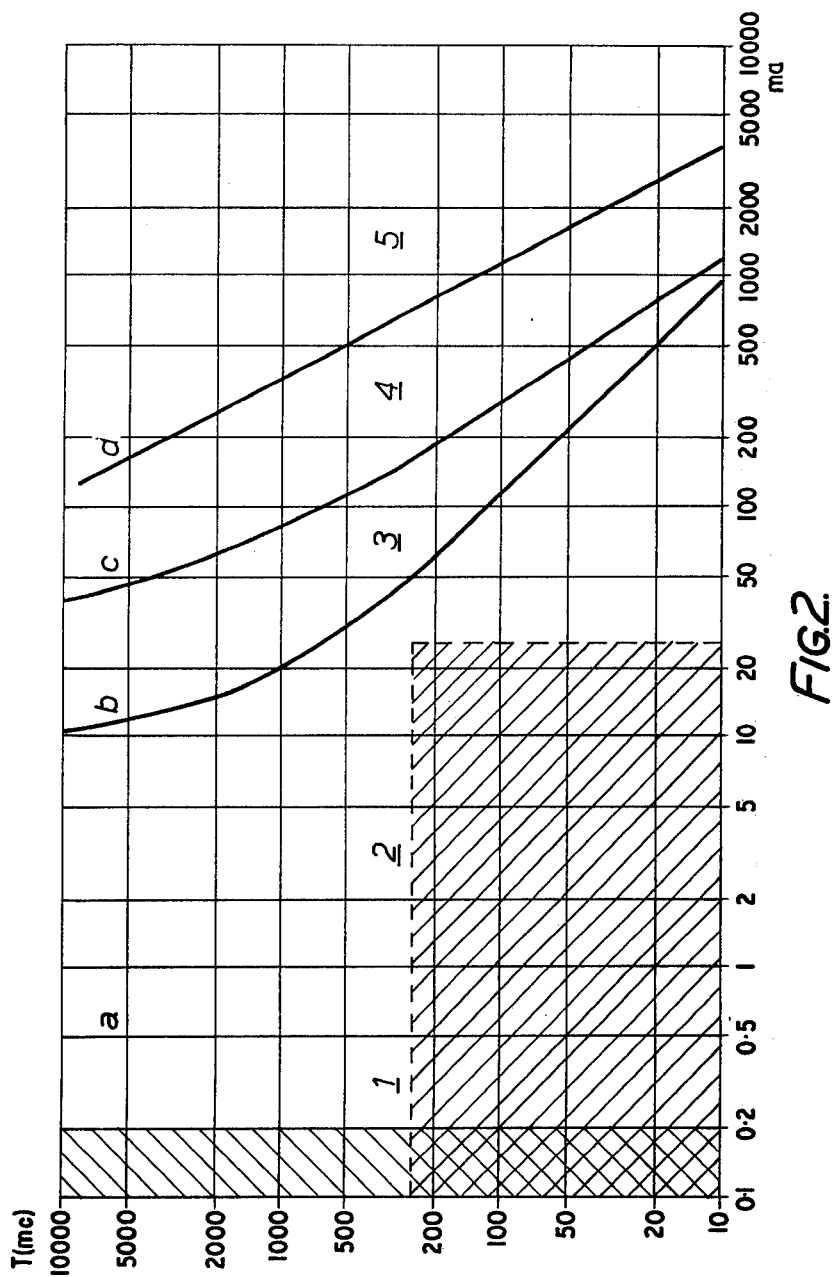
Figure 3:
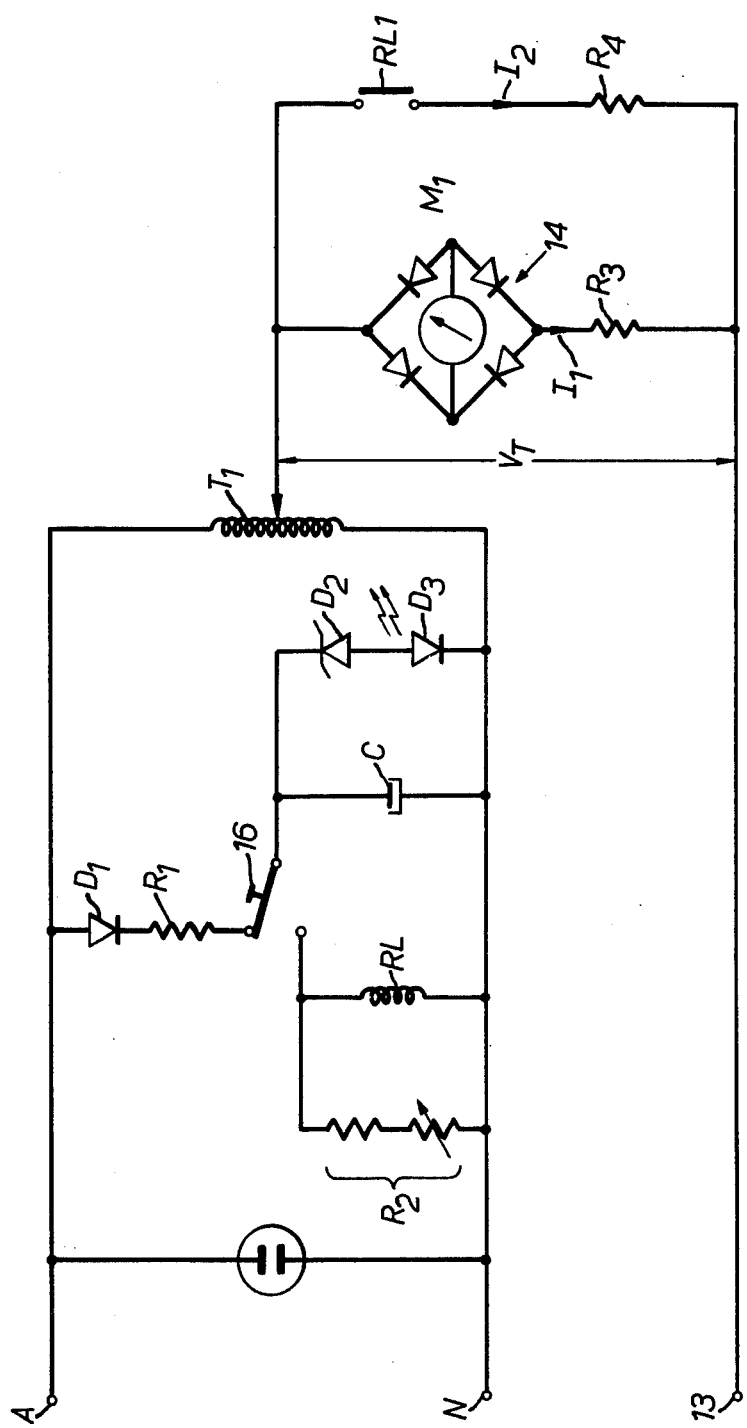

In order that the invention may be more readily understood and put into practical effect reference will now be made to the accompanying drawings in which:

FIG. 1 is a functional block diagram of a test unit for current-operated core balance devices according to one embodiment of the invention, FIG. 2 is a graphical representation of the zones of effects of alternating current (50/60 Hz) on adult persons, and, FIG. 3 is a circuit diagram of a preferred embodiment of the test unit shown in FIG. 1.

The basic unit for providing a test leakage current to an electric circuit containing a current-operated core balance protective device adapted to open a circuit containing the core balance unit upon the occurrence of a pre-determined leakage current is shown in FIG. 1. The system consists of an adjustable source of AC voltage 11 between one of the supply conductors 12 and earth 13. The voltage may be set on a calibrated dial or, more preferably, indicated on a high impedance metering circuit 14. The impedance of the metering circuit 14 should be such that the level of current flowing through the earthing conductor 13 is sufficiently small that, even when applied continuously, will not cause any reaction in human beings.

A practical limitation of test equipment arises from the fact that the neutral conductor of a low voltage distribution system, and particularly the neutral conductor in a private installation which is nominally at earth potential, frequently rises above earth potential. This creates some problems in design of equipment inasmuch as it is not possible to regard the neutral as being at the same potential as earth. The use of the high impedance metering circuit overcomes this problem by making the setting independent of the neutral potential.

Once the test voltage has been established the test impedance 15 is switched between the voltage source 11 and earth 13 to provide the required leakage, i.e. out-of-balance current. The switch 16 is arranged so that the contacts close for a pre-set maximum time which can be chosen so that sufficient time is allowed for the core balance relay to operate, but not long enough to cause any dangerous patho-physiological effect in human beings.

In this manner the test conditions can be pre-set without producing significant leakage current and the actual tripping current is only applied for a relatively short time.

The circuit diagram of a basic test system is shown in FIG. 3. Terminals A and N are connected to the active and neutral conductors respectively, and terminal 13 is connected to earth. In this instance, the voltage source 11 consists of a variable autotransformer $T_1$ which is used to pre-set a test voltage $V_T$ with respect to earth prior to initiation of the test. During this time the earth leakage current is at a maximum value $I_1$ determined by the meter sensitivity (typically 100–200 $\mu$A). Initially, the capacitor C is charged, with the switch 16 in the position shown in FIG. 3, through diode $D_1$ and resistor $R_1$ to a preselected voltage determined by zener diode $D_2$. When capacitor C is charged to the selected voltage, light-emitting diode $D_3$ will light up. Once the test voltage has been set, the leakage current is applied by operating switch 16, this causes the relay RL to operate for a period of time determined by the time constant RC where R is the parallel combination of $R_2$ and the coil resistance of RL. By operating switch 16, capacitor C is discharged through $R_2$ and relay coil RL. When relay coil RL is energized, relay contacts $RL_1$ are closed.

Closure of the relay contacts RL1 increases the test current for the pre-determined time to a value:

$$I_{TEST} = I_1 + I_2 \approx V_T/R_3 + V_T/R_4 \text{ (neglecting the meter voltage drop)} = V_T(1/R_3 + 1/R_4)$$

Since $R_3$ and $R_4$ are fixed the test leakage current is proportional to $V_T$ and hence the voltmeter M1 can be calibrated directly in milliamps of leakage current.

When the switch 16 is released, C charges again via $D_1$ and $R_1$ to a voltage determined by zener diode $D_2$ in series with light emitting diode $D_3$. The light emitting diode $D_3$ indicates when the capacitor is fully charged and the unit is ready for another test pulse.

The circuit design and component values for the preferred embodiment of the invention have been selected to ensure that the leakage current applied to the installation during testing is sufficient to operate core balance relays complying with the requirements of the Australian Standard whilst still remaining within internationally recognised safe levels as described in IEC Report, Publication 479, 1974, "Effects of current passing through the human body". Typical areas of operation are plotted on FIG. 2, which shows the zones of effect of AC current on adult persons as described in the IEC publication, the zones are:

Zone 1: Usually no reaction effect.
Zone 2: Usually no patho-physiologically dangerous effect.
Zone 3: Usually no danger of fibrillation.
Zone 4: Fibrillation possible (up to 50% probability).
Zone 5: Fibrillation danger (more than 50% probability).

It will be noted that the leakage current applied during adjustment of the test unit (i.e. whilst the magnitude of the leakage current is being selected) is less than 200 $\mu$A which lies within Zone 1 of FIG. 2 and thus the test current will have no effect on adult persons. During the test pulse the test leakage current is adjustable to a maximum of 30 mA and is applied for a maximum time of 250 milliseconds so that the time-current characteristic of the test leakage current falls within Zone 2 of FIG. 2. Thus, the test leakage current will be contained within the hatched area of FIG. 2 and will remain below the threshold at which dangerous patho-physiological effects are to be expected (indicated by line b in FIG. 2.). The vertical band in FIG. 2 represents the time-current characteristic during adjustment of the test leakage current and it will be seen that even after prolonged current flow, the band will not meet threshold line b.

The circuit constants can of course be varied to comply with any national or international requirements for leakage current and exposure time which may emerge from further research.

Alternative methods of deriving the test leakage current in the basic system could consist of a stepped voltage source or an adjustable test impedance in conjunction with a fixed voltage source whilst still utilizing the basic concept of limiting the duration of the leakage current.

The above equipment may be combined with any or all of the following additional test systems:
(i) Meters or indicators to monitor correct polarisation of active and neutral wiring and/or to indicate continuity of the earth circuit.
(ii) A measuring circuit to determine the elapsed time for the protection device to interrupt the circuit after the test leakage current has been applied.

Various modifications in design and details of the test unit will, of course, be readily apparent to persons skilled in the art and may be made without departing from the scope and ambit of the invention.

We claim:

1. A test unit for checking the operation of a current operated core balance protective device connected between the active and neutral conductors of an AC supply circuit through the application to the supply circuit of an AC test leakage current selectable from a predetermined range, said unit comprising:

A. Terminals for connection to the active and neutral conductors and to earth,
B. First circuit means including a variable auto transformer connected between the active and neutral terminals, with the output of the auto transformer providing a test voltage between it and the earth terminal, and a high impedance metering circuit connected between the auto transformer output and the earth terminal to provide a read-out of the test voltage, the high impedance being of such value that the current flowing therethrough and from the supply circuit whilst the test voltage is being selected will be sufficiently small that even when applied for a prolonged period of time the time-current characteristic will not cause any reaction effect in human beings, C. Second circuit means connected between the auto transformer output and the earth terminal including an impedance of predetermined value to which the selected test voltage is applied to produce a leakage current therethrough, the AC test leakage current then being the sum of the current through the metering circuit and that through said impedance, D. Switching means isolating the second circuit means from the auto transformer output whilst the test voltage is being selected and for applying the selected test voltage to the second circuit means when the operation of the current operated core balance protective device is to be checked, and E. Time control means operative to limit the application of the test leakage current to the supply circuit so that the time-current characteristic of the test leakage current is below the threshold at which dangerous patho-physiological effects are to be expected.

2. A test unit according to claim 1 wherein the time control means includes a resistance (R) — capacitance (C) network of time constant RC.

* * * * *